US006859413B2

(12) United States Patent
Phan et al.

(10) Patent No.: US 6,859,413 B2
(45) Date of Patent: Feb. 22, 2005

(54) METHOD AND APPARATUS FOR DLL LOCK LATENCY DETECTION

(75) Inventors: John T. Phan, Williston, VT (US); Michael Armand Roberge, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/260,087

(22) Filed: Sep. 27, 2002

(65) Prior Publication Data

US 2004/0062137 A1 Apr. 1, 2004

(51) Int. Cl.[7] .................................................. G11C 8/00
(52) U.S. Cl. ....................................... 365/233; 365/194
(58) Field of Search ................................. 365/194, 233

(56) References Cited

U.S. PATENT DOCUMENTS

| | | | |
|---|---|---|---|
| 3,624,281 A | 11/1971 | Plan | 386/12 |
| 5,878,094 A | 3/1999 | Nowak et al. | 375/349 |
| 5,893,917 A | 4/1999 | Derr | 711/105 |
| 6,088,206 A | 7/2000 | Chan et al. | 361/91.1 |
| 6,177,833 B1 | 1/2001 | Gabric et al. | 327/565 |
| 6,396,887 B1 * | 5/2002 | Ware et al. | 375/354 |
| 6,426,668 B1 | 7/2002 | Morrish et al. | 327/525 |
| 2004/0019815 A1 | 1/2004 | Vyssotski et al. | |
| 2004/0030853 A1 | 2/2004 | Welker et al. | |
| 2004/0062137 A1 | 4/2004 | Phan et al. | |

* cited by examiner

*Primary Examiner*—M. Tran
(74) *Attorney, Agent, or Firm*—Daryl K. Neff; Joseph P. Abate

(57) ABSTRACT

Disclosed herein are a method and structure, in an integrated circuit having at least one delay locked loop circuit (DLL), for determining a Lock Latency value of a DLL output clock signal. The disclosed method includes temporarily disabling a first clock signal in response to the DLL doing at least one of approaching and acquiring lock; and then thereafter determining a Lock Latency value in response to examining a DLL output clock signal generated in response to the first clock signal.

19 Claims, 3 Drawing Sheets

DISABLE_PG
130
127
2.996
126
125
LOCK_2
LOCK_DETECT
140
1.12
180
120
150
RF_LOCKED
IbCLK
LOCKED
DLL_OUT
RESET

VCLK 210
DLLIN 360
LOCKED
DISABLE_PG 330
LOCK_DETECT_3
DLL_OUT
LOCK_3
220
230
312
340
350

METHOD AND APPARATUS FOR DLL LOCK LATENCY DETECTION

FIELD OF THE INVENTION

This invention relates to semiconductor devices and more particularly, to digital delay locked loops for use in high frequency clock synchronization applications.

BACKGROUND OF THE INVENTION

In synchronous dynamic random access memory (SDRAM) applications, the inherent analog delay between an external, system or reference clock and the time output data is always a concern. Even a slight delay may be large enough to make a following clock cycle overlap the data, thus causing the data not to be ready at the output during one cycle. This inherent internal delay must therefore be selectively accelerated according to the necessary frequency to resolve the problem. This leads to a new problem of achieving synchronization between the internal clock, which controls the output path, and the correct edge of the external clock. This is often referred to as a "Lock Latency", which is defined as relative time displacement between a given external clock edge (parent) and the associated internal DLL generated clock edge (child).

Conventional double data rate (DDR) synchronous dynamic random access memories (SDRAM) employ a plurality of delay locked loop circuits (DLL). These DLL circuits are employed to synchronize delay between two signals, such as the clock signal and a delayed clock signal. Analog delay locked loops have been employed in the past to perform the synchronization, which are comprised of a delay chain having the delay of its elements varied by analog bias voltages supplied by a phase detector. In digital systems such as memories, microprocessors and application specific integrated circuits, these types of delay locked loops introduce analog design complications in a mainly digital design, and therefore are avoided. Digital delay locked loops use a digitally adjustable delay line. Digital information is used to either include or exclude a certain number of delay elements within a delay chain. Although digital delay locked loops have a much higher jitter than analog delay locked loops, their ease of implementation in a digital system makes them the preferred solution in most digital applications. As digital delay locked loops become more prevalent, the need increases for a method and apparatus that can process transmitted/recieved signals synchronously with an I/O data stream.

SUMMARY OF THE INVENTION

Acccording to an aspect of the present invention, in an integrated circuit having at least one delay locked loop circuit (DLL), a method is provided for determining a Lock Latency value of a DLL output clock signal. Such method includes temporarily disabling a first clock signal in response to the DLL doing at least one of approaching and acquiring lock; and then thereafter determining a Lock Latency value in response to examining a DLL output clock signal generated in response to the first clock signal.

According to another aspect of the invention, a method and structure are provided for producing edge-aligned output signal(s) with respect to an external input clock (and each other when more than one output signal present). Such method can be applied in a double data rate (DDR) synchronous dynamic random access memory (SDRAM) environment with at least one delay locked loop circuit (DLL) and having one or more output signals and at least one external input clock. According to such aspect of the invention, a lock pulse generator is established using the external input clock. Any incoming signal(s) are then analyzed by using a Lock Latency mechanism to determine if the system has acquired lock. Then, a Lock Latency value is determined based on the incoming signal(s). The Lock Latency value is maintained until there is a frequency change in the external clock. The output signal(s) cycle(s) can then be altered based on the Lock Latency value when appropriate as to edge-align them with respect to the external input clock (and other output signal(s) when there is more than one output signal present).

DETAILED DESCRIPTION OF THE PREFERRED EMBODIMENTS

Figure 1:
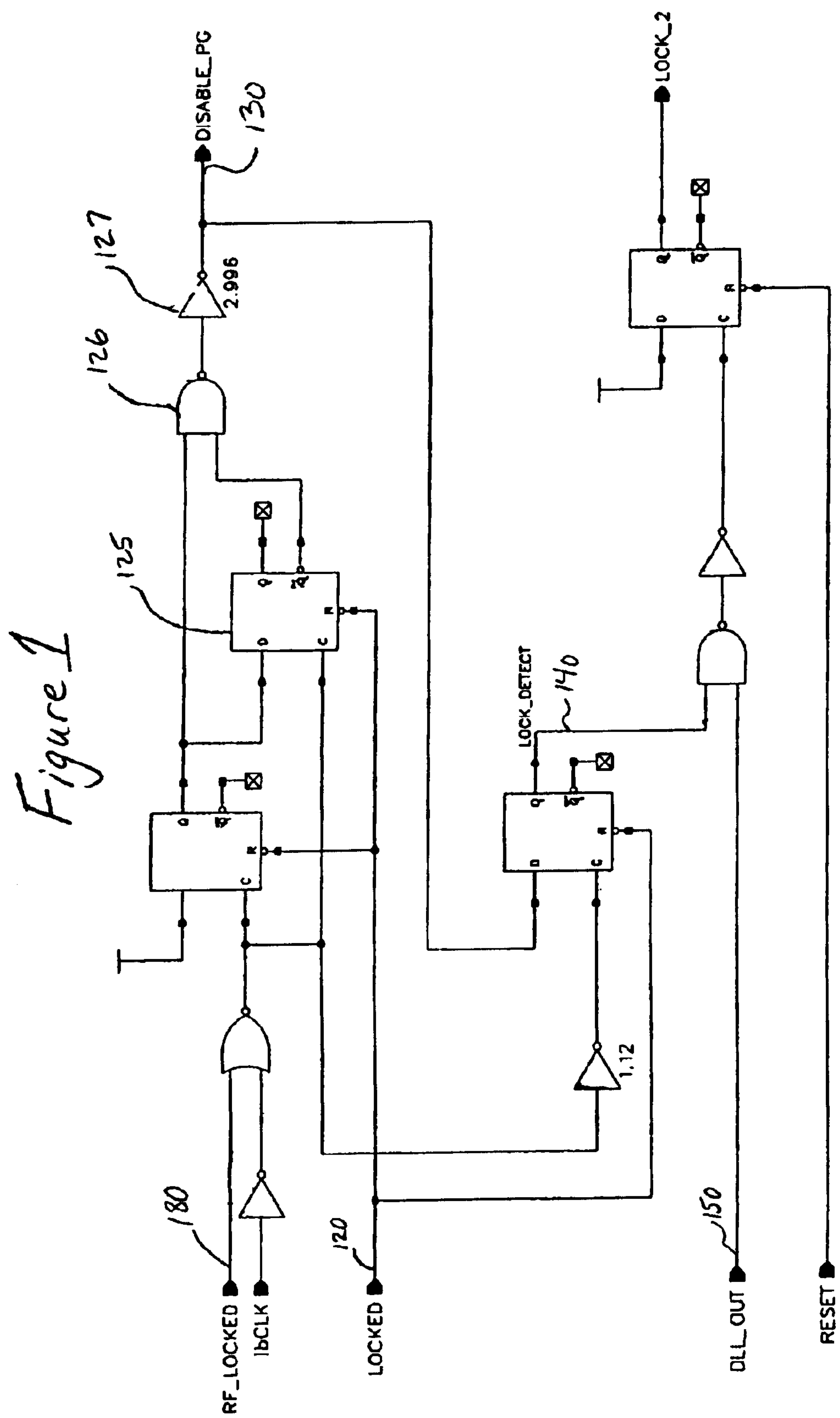
FIG. 1 is an illustration of a lock detection circuit as per one embodiment of the present invention.

The present invention provides in one embodiment a DDR SDRAM chip with the ability to ascertain the Lock Latency of it's on board Delay Locked Loop (DLL).

By design many DLL circuits create an external clock edge which is shifted (later) in time with respect to the parent externally supplied clock edge. Due to the cyclic nature of clocking signals, the magnitude of the insertion delay created by the DLL is quantized into multiples of clock cycles. For example, an external parent clock edge and it's associated internally generated DLL edge maybe displaced relative to each other by 2 clock cycles. In this case we would say the DLL has a Lock Latency of 2 (clock cycles).

In order to enhance performance and maintain functionality of the particular DLL, the knowledge of its Lock Latency is required. That is to say within each particular DLL architecture some values of Lock Latency are usable only and the problem is to know of the possible usable Lock Latency values, which one the DLL has settled on. Once the DDR SDRAM has knowledge of its current Lock Latency, it can auto-adjust internal circuits so that functionality is maintained over all possible valid Lock Latency values.

In the Double Data Rate (DDR) SDRAM memory chip, the data strobe signal (DQS) is transmitted/received synchronously with I/O Data for READ/WRITE operations respectively. The DQS signal is edge-aligned with output data for a memory READ operation and center-aligned with input data for a memory chip WRITE operation. Furthermore, DQS must switch one cycle earlier than associated I/O Data during a READ operation. Thus creating the required DOS Preamble as defined by the DDR specification. The focus here must be on the memory Read operation. Wherein the DDR SDRAM output signals (DQS and I/O Data), need to be edge-aligned not only with each other but also with the external input clock signals (CLK/CLKb).

In order to achieve the required edge alignments, DDR SDRAM chips employ an on board Delay Locked Loop (DLL). The DLL creates a precisely timed internal clock signal which is used by the Data Path/Output Driver circuits to create the required edge-alignment at the output data pins and the input clk pins. The internally generated DLL clock signal which meets these requirements is hereinafter referred to as a Latency Adjusted Clock. The edge alignment requirement imposes a constraint between the Latency Adjusted Clock and the externally supplied input clock (CLK/CLKb). The fact that they are linked by the alignment criteria which must be maintained over consecutive cycles, means that the signals have X (or X+360) degrees phase relationship with respect to each other. Wherein 'X' is phase shift required by the Latency Adjusted clock to produce the desired zero phase/tAC at the I/O pins. Since this is a periodic system, a phase relationship of X+(n*360 deg) where n=0, 1, 2, etc. are indistinguishable from a phase point of view. Note that in a cycle based system, 360 deg=1 cycle and n*360 deg=n*cycle and all would meet the zero tAC alignment criteria. However, it is important to point out that while n-cycles meets the zero phase requirement and n=1 vs. n=2, n=3, . . . , n=infinity cycles are indistinguishable from a phase relationship, not all values of 'n' are allowable solutions. Indeed, even though n=1 and n=2, or even taken to the limit, n=infinity, maybe indistinguishable in the frequency/phase domain, they are very much distinguishable in the time domain. Large values of 'n' are simply not feasible for a DLL that uses a Linear Delay Line. Simply because it can not afford the resources required to store the large time shifts dictated by large values of 'n'. In addition, as 'n' increases so does the initial propagation delay through the DLL. Given today's DDR SDRAM spec and our current DLL architecture, if 'n'>2 the initial propagation through the DLL would cause a failure of the Active Power Down Exit specification of 1 cycle. The term 'initial propagation' is used to describe the propagation time associated with reinstating a full-speed steady-state signal within the DLL signal pathway. For performance reasons many of the current DLL architectures do not always maintain a full-rate or otherwise steady-state signal in all operational modes.

In some of the present DDR SDRAM specifications, the chip can operate at more than one frequency (i.e. 83 MHz to 166 MHz), the DLL can either be locked in 1 or 2 cycles and still meet the application specification. However, the determination of Lock by the DLL in 1 cycle, 2 cycles, or more cycles depends on a number of factors, such as:

1) tAC delay=Total on chip delays=delay of the input clock receivers+Data Path circuits and clock tree wire delays+Off Chip Driver (OCD) delay+chip package delay+etc.;
2) Operating clock frequency—at higher frequencies, the DLL needs more time to compensate for the tAC delay therefore forcing the DLL to lock in 2, 3, or more cycles;
3) Insertion delay of the DLL—the larger the minimum Insertion delay associated with the Delay Line, the high the probability that the DLL will have to move to the next cycle of Lock to compensate for this insertion delay.

Taken as a collection of variables, the above itemized issues leads to an unknown Lock Latency within the DLL. That is, given one set of conditions, the resulting Lock Latency maybe 1, 2, 3 or more. It is therefore desirable to know what the Lock value is, so that the internal Data Path circuits can track and compensate for this variability and thus preserve functionality. Even though many of the current DLL architectures are capable of locking to values greater than 2, the only valid values in many of the current specifications (such as the JEDEC specifications) remain as a 1 or a 2. With this in mind, the embodiment of the invention shown in FIGS. 1 and 2 described below only distinguishes between Lock Latency values of 1 and 2. However, following the description of this embodiment, it will be further described how the concepts of the present invention are applied to detect any number of different Lock Latency values.

Figure 2:
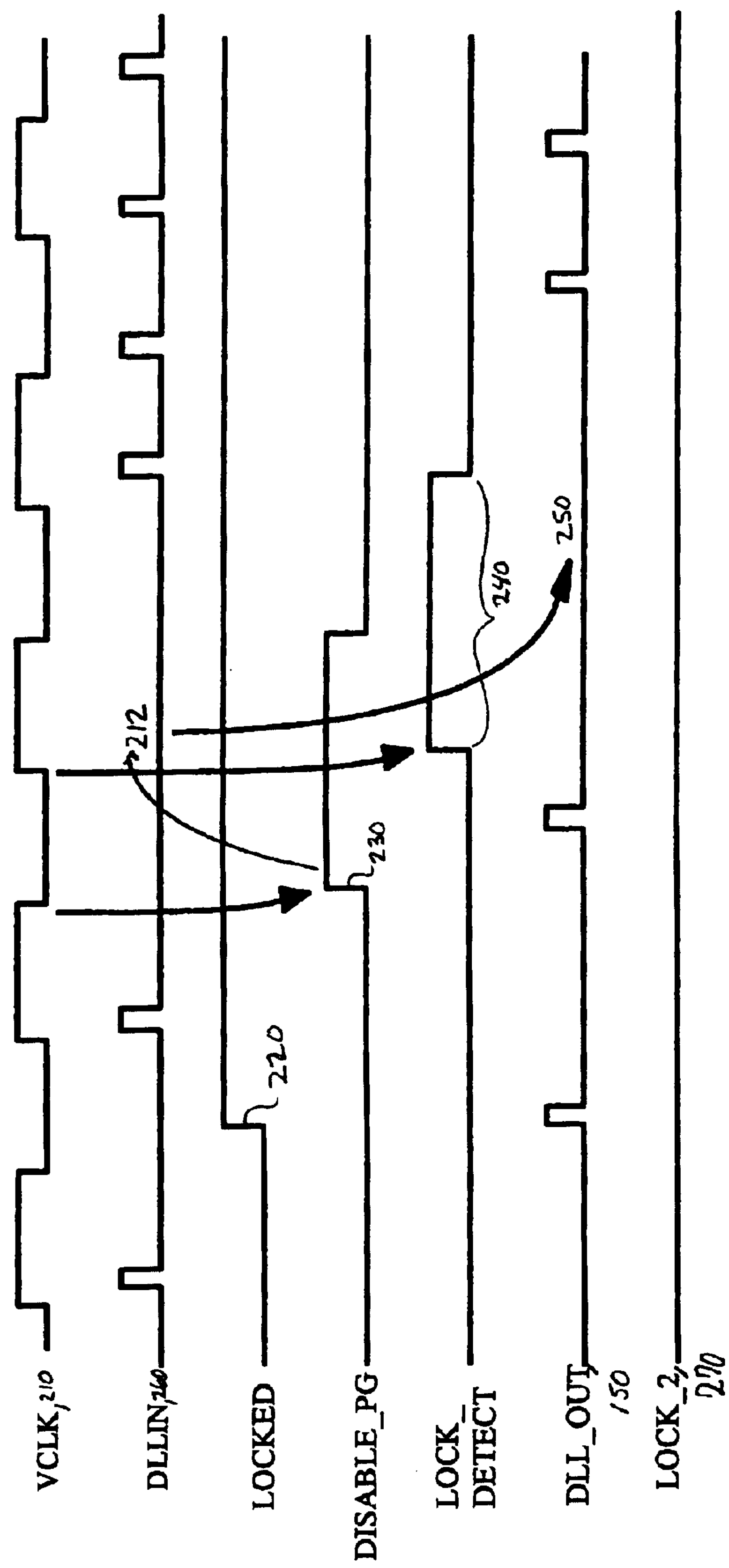
FIG. 2 shows the associated timing diagram for FIG. 1.

In one embodiment of the present invention as shown in FIG. 1, a lock detection circuit is presented. FIG. 2 provides an example of the associated timing diagram for FIG. 1. The embodiment shown in FIG. 1 illustrates the lock detection circuit in a DDR SDRAM environment.

In FIG. 2, before the DLL achieves a lock acquisition, only the VCLK pulse generator is running as shown at (210). When the DLL first locks, as shown at (120) in FIG. 1, the signal LOCKED is asserted high, shown at (220) in FIG. 2. This signal, in turn, causes the signal DISABLE_PG to turn high at point 230 (after going through the electronic components shown in FIG. 1 as 125, 126 and 127). In response, the VCLK pulse generator turns off for one complete cycle as shown at (212) in FIG. 2. Also, in response to DISABLE_PG, a detection window is generated (LOCK_DETECT signal) as shown in FIG. 1 at 140, which is one cycle wide and shifted by a half cycle, as shown at (240) in FIG. 2. During this detection window, the Lock Detection circuit examines the DLL output (shown at (150) in FIG. 1) signal, DLL_OUT. If the DLL has a Lock Latency of one cycle as shown at (250) in FIG. 2, then the LOCK_2 signal stays low as shown at (270) in FIG. 2, indicating that there was no clock pulse present in the detection window. If the DLL has a Lock Latency of two cycles, the LOCK_2 signal will go high, indicating the presence of a pulse in the detection window. The pulse is present because it is already in the delay line before the DISABLE_PG signal becomes active, and then a delayed version of it arrives in the DLL_OUT signal at a time when the detection window is open. After the DLL completely locks, the RF_LOCKED signal, shown at (180) in FIG. 1, is asserted high. This, in turn, completes the Lock Latency detection step. The resulting Lock Latency value is held by a latch. As such, the Lock Latency status is only assessed at DLL initialization time.

In the embodiment shown in FIGS. 1 and 2, it is preferable that the DDR SDRAM has a power up initialization procedure. During the initialization procedure, the DLL is given adequate clock cycles, preferably around 200 cycles, to establish a stable lock with the external clock. Once lock is achieved, the Lock Detection circuit will analyze the supplied signals and determine the Lock Latency. This information is latched and maintained until the DLL is reset. If the operating clock frequency is changed, the DLL needs to be reset and re-locked in order for the Lock Detection function to work properly.

The foregoing description relates to a circuit for distinguishing between Lock Latency values of 1 and 2. Modifications to the circuit will now be described for determining Lock Latency values greater than two. Conceptually, the method is to disable DLLIN (the input clock signal of the DLL) for at least as long as one cycle less than the maximum Lock Latency value, and then set up one or more detection windows to examine the DLL output clock signal, at different times, to distinguish between the Lock Latency values of interest. For example, if it is desired to distinguish between Lock Latency values of 1, 2, and 3, the DISABLE_PG signal 130 must remain high for two cycles of VCLK and at least two detection windows are needed, the first detection window to distinguish between Lock Latencies of 1 and 2, and the second detection window to distinguish between Lock Latencies of 2 and 3. Further, the DLL output clock signal must be examined in both detection windows. If, however, in a particular system design, a Lock Latency of 1 will not occur, but values of 2 and 3 are possible, there need not be a detection window to distinguish between Lock Latencies of 1 and 2, but only a detection window for distinguishing between values of 2 and 3.

Figure 3:
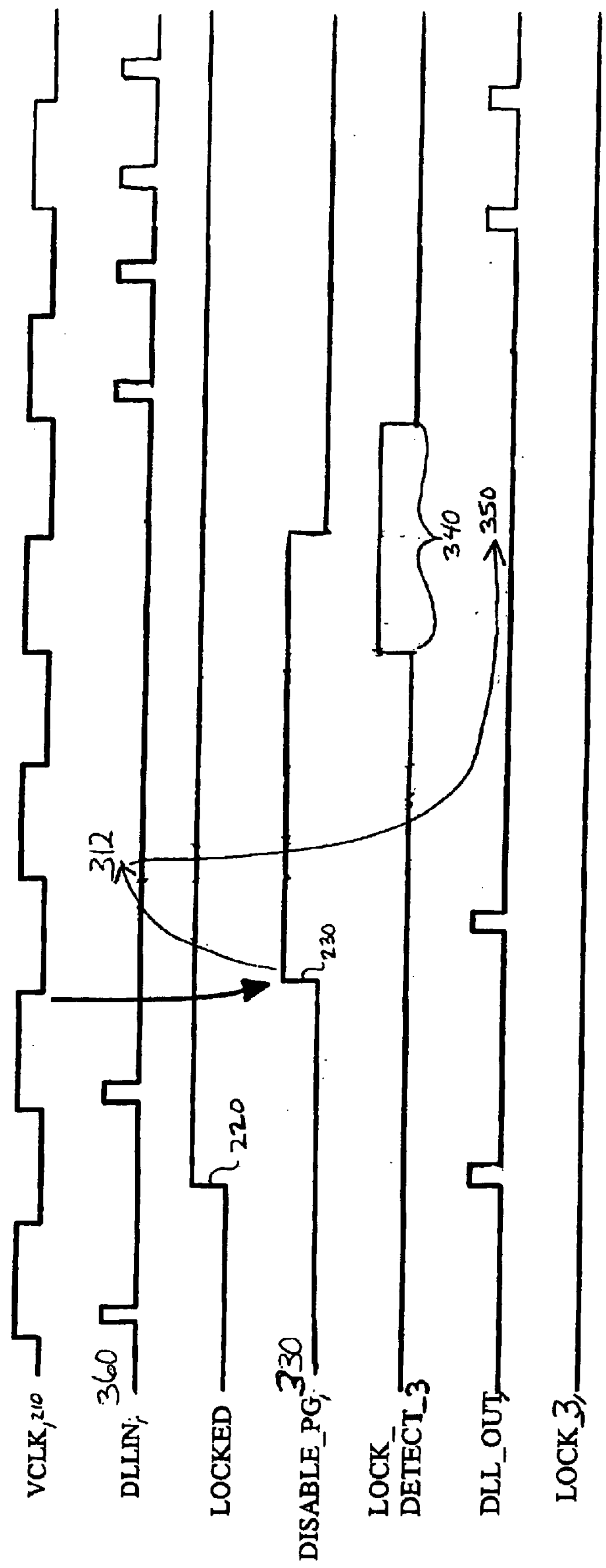
FIG. 3 is a timing diagram illustrating a method for distinguishing between Lock Latency values of 2 and 3, according to an embodiment of the invention.

FIG. 3 illustrates a timing diagram for distinguishing between Lock Latency values of 2 and 3. The method illustrated by this timing diagram is used in conjunction with the method exemplified in FIG. 2 to detect Lock Latencies of 1, 2 and 3, as described as follows. As illustrated in FIG. 3, the DISABLE_PG signal 330 remains high for two cycles, instead of one cycle which is shown in FIG. 2. This causes DLLIN 360 to turn off for two cycles of VCLK 210. In this embodiment, it will be appreciated that this modified two cycle long signal DISABLE_PG 330 is the same signal for detemining Lock Latencies of 2 or 3, as shown in FIG. 3, and also used for determining Lock Latencies of 1 or 2 (FIG. 2), except as now modified to be two cycles long.

The second detection window (LOCK_DETECT_3) 340, varies from a first detection window (LOCK_DETECT) 240 of FIG. 2 in that it starts later by one cycle of VCLK 210, in order to check for presence of a later pulse in DLL_OUT at time 350. Thus, when the Lock Latency of the DLL is 2, the DLLIN clock signal 360 will have no pulse present at time 312. The absence of the DLLIN pulse, in turn, will be reflected in signal DLL_OUT still having no pulse present in the output, at time 350, two cycles of the new output clock frequency later. In such case, the signal LOCK_3 remains low, indicating a Lock Latency value of 2. If, at the same time, a pulse is present in the first detection window (LOCK_DETECT) 240, then, as described above, the Lock Latency value is determined to be two, and LOCK_2 (270) is raised to indicate the same. If however, no pulse is present in either detection window, LOCK_DETECT or LOCK_DETECT_3), then the Lock Latency value is determined to be one, and neither LOCK_2 nor LOCK_3 are raised.

On the other hand, when the Lock Latency of the DLL is three, there will be a pulse at time 350 in the output clock signal DLL_OUT, because a pulse is present in the delay line already from a time prior to DISABLE_PG 330 being raised, and has now emerged in DLL_OUT. In such case, the pulse will be detected during the second detection window 340, and the signal LOCK_3 will be raised to indicate a Lock Latency value of three.

Those skilled in the art will understand the modifications to be made to the circuitry shown in FIG. 1 to permit operation according to the timing diagram of FIG. 3. In addition, it will be understood the modifications required for determining any arbitrary number of Lock Latency values, by making modifications, as described in the foregoing relative to FIG. 3.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. In an integrated circuit having at least one delay locked loop circuit (DLL), a method of determining a Lock Latency value of a DLL output clock signal, comprising:

temporarily disabling a first dock signal in response to said DLL doing at least one of approaching and acquiring lock;

thereafter determining a Lock Latency value in response to checking for presence at a pulse in a DLL output clock signal generated in response to said first clock signal.

2. The method of claim 1 wherein said Lock Latency value is determined to be one if said pulse is absent in a first determination period after said first clock signal is disabled.

3. The method of claim 1, wherein said Lock Latency value is determined to be two if said pulse is present in a first determination period after said first clock signal is disabled.

4. The method of claim 1 further comprising enabling said DLL output clock signal to be outputted in response to determining said Lock Latency value.

5. The method of claim 1, wherein said method is performed in response to initialization of said DLL.

6. The method of claim 1, wherein said method is performed in response to a change in frequency of said first clock signal.

7. In an integrated circuit, having at least one delay locked loop circuit (DLL), one or more output signals, and at least one external input dock, a method of edge-aligning said output signals with one another and with said external input clock(s), comprising:

establishing a lock pulse generator using said external input clock;

analyzing one or more incoming signals by using a Lock Latency mechanism to determine if a lock is present;

calculating a Lock Latency value based on said one or more incoming signals;

maintaining said Lock Latency value until there is a frequency change in said external input clock; and altering one or more cycles of at least one output signal on said Lock Latency value when appropriate as to edge-align them with respect to said external input clock and one another, when there is more than one output signal present.

8. The method of claim 7, wherein the step of analyzing said one or more incoming signals further comprises the step of enabling a lock detection mechanism when there is a lock present.

9. The method of claim 7, wherein the step of calculating a Lock Latency value further comprises the step of analyzing the length of cycles of all said output signals.

10. The method of claim 7, wherein said Lock Latency value is maintained by using a latch.

11. The method of claim 7, wherein said Lock Latency mechanism delays any incoming signals to achieve sold edge-aligned output signals.

12. The method of claim 7, wherein said Lock Latency mechanism shifts any incoming signals to achieve said edge-aligned output signals.

13. In a double data rate (DDR) synchronous dynamic random access memory (SDRAM) environment using a Lock Latency architecture having at least one delay locked loop circuit (DLL), said DLL having one or more input signals and one more output signals and at least one input clock, a method for determining Lock Latency values usable by said DLL, comprising the steps:

examining said one or more input signals and establishing a lock when appropriate;

after establishing a lock, inactivating said input clock for a selected number of cycles of an external dock reference;

activating a lock-detect mechanism, said lock detection mechanism examining length of said one or more output signals and then establishing a Lock Latency value based on said length;

activating a special lock component when said length is larger than a predetermined value; and maintaining said active state of said special lock component until it has to be reset.

14. The method of claim 13, wherein said lock detect mechanism further comprises a disable detect component.

15. The method of claim 13, wherein said Lock Latency mechanism delays said one or more input signals to achieve edge-aligned output signals.

16. The method of claim 13, wherein said lock component is activated when said length of said output signal is longer than one cycle of said external clock reference.

17. The method of claim 13, wherein said Lock Latency value is stored in a latch.

18. The method of claim 13, wherein said Lock Latency value is reset whenever a frequency of said external clock reference changes.

19. In a double data rate (DDR) synchronous dynamic random access memory (SORAM) environment having at least one delay locked loop circuit (DLL) and having one or more output signals and at least one external input clock, an apparatus for edge-aligning output signals with one another and with said external input clock, comprising:

a lock signal pulse generator operable to establish a lock signal pulse based on frequency of said external input clock and receipt of one or more incoming signals;

a Lock Latency mechanism operable to determine if a lock pulse is present;

a Lock Latency value calculator operable to generate a Lock Latency value when said lock pulse is present; and a latch operable to maintain said Lock Latency value until the frequency said external clock is changed.

* * * * *